(12) United States Patent
Callaway et al.

(10) Patent No.: US 12,311,578 B2
(45) Date of Patent: May 27, 2025

(54) EDGE-SEALED FIXTURE FOR PROCESSING CMC

(71) Applicant: RAYTHEON TECHNOLOGIES CORPORATION, Farmington, CT (US)

(72) Inventors: Evan B. Callaway, Santa Barbara, CA (US); Zachary Paul Konopaske, West Hartford, CT (US); Olivier H. Sudre, Glastonbury, CT (US); Douglas F. Long, Mission Viejo, CA (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 18/071,078

(22) Filed: Nov. 29, 2022

(65) Prior Publication Data
US 2024/0173893 A1 May 30, 2024

(51) Int. Cl.
*B28D 7/04* (2006.01)
*C04B 41/45* (2006.01)

(52) U.S. Cl.
CPC ............ *B28D 7/04* (2013.01); *C04B 41/4511* (2013.01); *C04B 41/4529* (2013.01)

(58) Field of Classification Search
CPC . C23C 16/045; C23C 16/458; C23C 16/4409; C04B 2235/614; C04B 35/80; C04B 35/565; C04B 2235/5244
See application file for complete search history.

(56) References Cited

U.S. PATENT DOCUMENTS

| RE34,825 E | 1/1995 | Warren |
| 9,574,592 B2 | 2/2017 | Hand et al. |
| 10,392,696 B2 | 8/2019 | Bertrand et al. |
| 10,906,842 B2 | 2/2021 | Shi et al. |
| 11,046,620 B2 | 6/2021 | Shim et al. |

(Continued)

FOREIGN PATENT DOCUMENTS

| FR | 3021671 | 12/2015 |
| WO | 20210165599 | 8/2021 |

OTHER PUBLICATIONS

Consolidation Method Using Gas Phase Infiltration; Patent No. 2021165599; Document ID: WO 2021165599 A1; Date Published: Aug. 26, 2021; Date Filed: Feb. 10, 2021; Inventor Name Goujard (Year: 2021).*

(Continued)

*Primary Examiner* — Mahdi H Nejad
(74) *Attorney, Agent, or Firm* — Carlson, Gaskey & Olds, P.C.

(57) ABSTRACT

A fixture for processing a ceramic matrix composite article includes first and second tool segments that each have an exterior side and an interior side. The interior side has a border mate face, and the interior side of the first tool segment faces the interior side of the second tool segment such that the border mate faces align and circumscribe a working region for holding a fiber preform that is to be coated with a ceramic material. The tool segments each having an array of through-holes that open to the working region to permit inflow of gaseous precursor into the working region. A seal circumscribes the working region and blocks a gap between the border mate faces to limit inflow of the gaseous precursor through the gap into the working region.

13 Claims, 4 Drawing Sheets

(56) References Cited

U.S. PATENT DOCUMENTS

| | | | |
|---|---|---|---|
| 11,255,206 B2 | 2/2022 | Overholser | |
| 11,472,747 B2 | 10/2022 | Ritchey | |
| 2015/0016971 A1* | 1/2015 | Freeman | F01D 5/282 |
| | | | 277/312 |
| 2020/0061868 A1* | 2/2020 | Thibaud | C04B 35/565 |
| 2023/0242451 A1* | 8/2023 | Gray | C04B 35/573 |
| | | | 501/99 |

OTHER PUBLICATIONS

Conformer for Gas Phase Consolidation And / Or Densification of a Fibrous Preform; Document ID FR 3021671 A1; Date Published: Dec. 4, 2015; Inventor Name: Bertrand Sebastien; Date Filed: May 28, 2014 (Year: 2014).*
European Search Report for European Patent Application No. 23211579.0 mailed May 2, 2024.

* cited by examiner

EDGE-SEALED FIXTURE FOR PROCESSING CMC

BACKGROUND

A gas turbine engine typically includes a fan section, a compressor section, a combustor section and a turbine section. Air entering the compressor section is compressed and delivered into the combustion section where it is mixed with fuel and ignited to generate a high-pressure and temperature exhaust gas flow. The high-pressure and temperature exhaust gas flow expands through the turbine section to drive the compressor and the fan section. The compressor section may include low and high pressure compressors, and the turbine section may also include low and high pressure turbines.

Articles in the turbine section are typically formed of a superalloy and may include thermal barrier coatings to extend temperature capability and lifetime. Ceramic matrix composite ("CMC") materials are also being considered for turbine article. Among other attractive properties, CMCs have high temperature resistance. Despite this attribute, however, there are unique challenges to implementing CMCs in turbine articles.

SUMMARY

A fixture for processing a ceramic matrix composite article according to an example of the present disclosure includes first and second tool segments that each have an exterior side and an interior side. The interior side has a border mate face. The interior side of the first tool segment faces the interior side of the second tool segment such that the border mate faces align and circumscribe a working region for holding a fiber preform that is to be coated with a ceramic material. The first and second tool segments each have an array of through-holes that open to the working region to permit inflow of gaseous precursor into the working region. A seal circumscribes the working region. The seal blocks a gap between the border mate faces to limit inflow of the gaseous coating material through the gap into the working region.

In a further embodiment of any of the foregoing embodiments, the first and second tool segments and the seal are graphite.

In a further embodiment of any of the foregoing embodiments, the seal includes a first face that is in contact with the border mate face of the first tool segment and a second, opposed face that is in contact with the border mate face of the second tool segment.

In a further embodiment of any of the foregoing embodiments, the seal is united with the first tool segment.

In a further embodiment of any of the foregoing embodiments, the first and second tool segments each include a support surface facing the working region and through which the through-holes extend, and the border mate face of the second tool segment is recessed from the support surface of the second tool segment such that the support surface of the second tool segment is on a plateau.

In a further embodiment of any of the foregoing embodiments, the support surface of the first tool segment is recessed from the seal.

A further embodiment of any of the foregoing embodiments further comprises one or more spacers between the seal and the second tool segment, the one or more spacers having a spacer height that establishes a height of the working region between the support surfaces.

In a further embodiment of any of the foregoing embodiments, the seal includes a stand-off projecting there from to a free tip. The free tip contacts a side of the plateau.

In a further embodiment of any of the foregoing embodiments, the stand-off is a ridge that circumscribes the plateau.

In a further embodiment of any of the foregoing embodiments, the first and second tool segments and the seal include two or more sets of pin holes that are aligned, and two or more pins receivable in the two or more sets of pin holes. The pins align and secure the seal with respect to the first and second tool segments.

In a further embodiment of any of the foregoing embodiments, the seal is a band wrapped around the first and second tool segments.

A fixture for processing a ceramic matrix composite article according to an example of the present disclosure includes first and second tool segments that each have an exterior side and an interior side. The interior side has a border mate face. The interior side of the first tool segment faces the interior side of the second tool segment such that the border mate face of the first tool segment aligns with the border mate face of the second tool segment. The border mate faces align and circumscribe a working region for holding a fiber preform that is to be coated with a ceramic material. The first and second tool segments each have an array of through-holes that open to the working region to permit inflow of gaseous precursor from the exterior side into the working region. A band wrapped around the first and second tool segments seals a gap between the border mate faces to limit inflow of the gaseous coating material through the gap into the working region.

In a further embodiment of any of the foregoing embodiments, the band includes a fabric.

In a further embodiment of any of the foregoing embodiments, the band includes foil.

In a further embodiment of any of the foregoing embodiments, the band includes an adhesive tape.

A method for processing a ceramic matrix composite article according to an example of the present disclosure includes providing a fixture that includes first and second tool segments that each have an exterior side and an interior side. The interior side has a border mate face. The interior side of the first tool segment faces the interior side of the second tool segment such that the border mate faces align and circumscribe a working region. The first and second tool segments each have an array of through-holes that open to the working region. A fiber preform is then situated in the working region, and a seal is provided that circumscribes the working region. The fixture with the preform is then exposed to a flow of gaseous precursor. The gaseous precursor flows into the working region and infiltrates the fiber preform to deposit a coating on the fiber preform. The seal blocks a gap between the border mate faces to limit inflow of the gaseous precursor through the gap into the working region so that the gaseous precursor must flow through the through-holes to reach the working region.

In a further embodiment of any of the foregoing embodiments, the providing of the seal includes arranging the seal between the first and second tool segments.

In a further embodiment of any of the foregoing embodiments, the providing of the seal includes wrapping a band around the first and second tool segments.

In a further embodiment of any of the foregoing embodiments, the band includes at least one of a fabric, a foil, or an adhesive tape.

The present disclosure may include any one or more of the individual features disclosed above and/or below alone or in any combination thereof.

BRIEF DESCRIPTION OF THE DRAWINGS

The various features and advantages of the present disclosure will become apparent to those skilled in the art from the following detailed description. The drawings that accompany the detailed description can be briefly described as follows.

In this disclosure, like reference numerals designate like elements where appropriate and reference numerals with the addition of one-hundred or multiples thereof designate modified elements that are understood to incorporate the same features and benefits of the corresponding elements.

DETAILED DESCRIPTION

Ceramic matrix composite (CMC) articles, such as but not limited to airfoils, blade outer air seals, and combustor panels for gas turbine engines, may be fabricated via infiltration of a gaseous ceramic precursor compound (or precursors thereto) into a fiber preform to form a ceramic coating on the fiber surfaces. In instances where the fiber preform is not self-supporting, a fixture may be used to support the preform in the desired geometry during processing. The fixture hinders flow of the precursor material to some regions of the fiber preform while permitting flow to other regions, thereby contributing to uneven build-up of the ceramic material and concomitant lower performance of the article. Additionally, multiple fiber preforms may be processed simultaneously in a chamber through which the gaseous precursor flows. The flow may vary by spatial location in the chamber, thereby further contributing to uneven build-ups between articles that receive more or less flow. In these regards, as will be described below, the disclosed fixture facilitates improved uniformity of the build-up of a ceramic material in a fiber preform.

Figure 1:
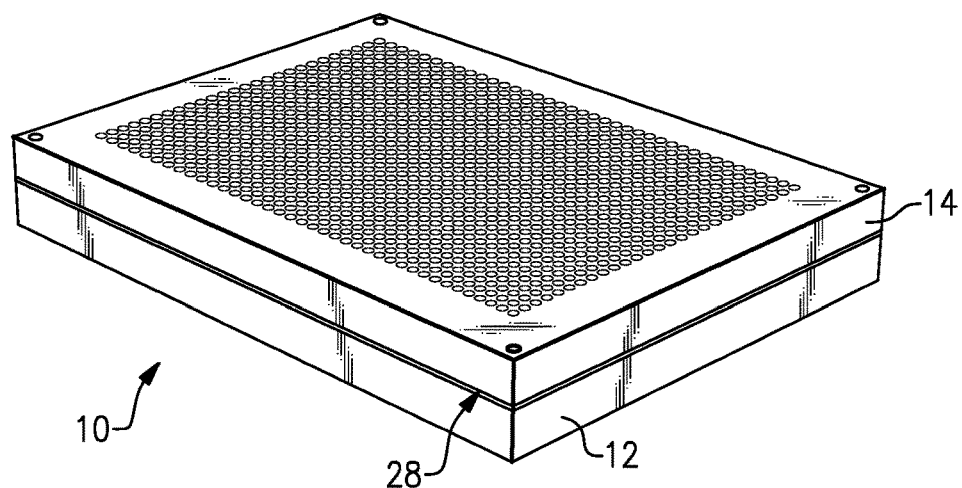
FIG. 1 a fixture for processing a ceramic matrix composite article.
Figure 2:
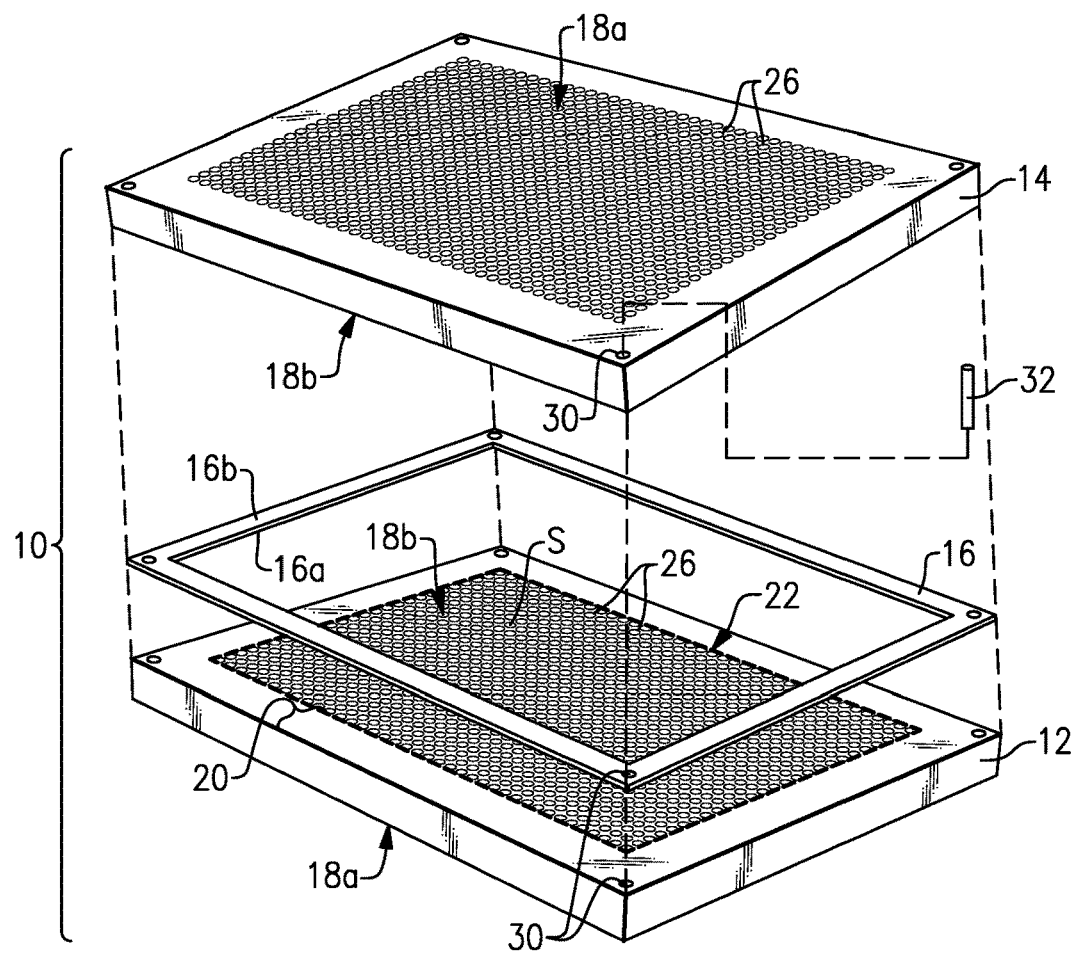
FIG. 2 illustrates the fixture of FIG. 1 but in an expanded view.

FIG. 1 illustrates an example fixture 10 in a fully assembled state for processing, and FIG. 2 illustrates an expanded view of the fixture 10. The fixture 10 is depicted with a generic flat plate geometry, but it is to be understood that the geometry will be adapted to the geometry of the end-use article that is to be produced. The fixture 10 includes first and second tool segments 12/14 and a seal 16. In general, the segments 12/14 and seal 16 are made of materials that are inert with respect to the precursor gas used in the processing, have a maximum use temperature that exceeds the temperature at which the processing is to be conducted, and are of sufficient strength to resist breaking during processing and handling such that they can be reused. For instance, the material may be, but is not limited to, graphite (e.g., carbon graphite composites such as C-fiber/C-matrix composites).

Each of the tool segments 12/14 has an exterior side 18a and an interior side 18b. For contoured articles, such as airfoils or blade outer air seals, at least the interior sides 18b may be contoured with the article geometry, such as with a cavity. The interior side 18b has a border mate face 20 (obscured from view on the tool segment 14). The border mate faces 20 are relatively smooth surface perimeter regions that extend inwardly from the edges of the tool segments 12/14 and serve to facilitate assembly and alignment of the tool segments 12/14. The interior sides 18b face each other such that the border mate faces 20 substantially align with each other and circumscribe a working region 22 for holding a fiber preform 24 that is to be infiltrated with the precursor.

The working region 22 is the volume circumscribed by the border mate faces 20 and bound by support surfaces S on the interior sides 18b of the tool segments 12/14. The fiber preform 24 is held in the working region 22 and mechanically supported by the support surfaces S. The terms "interior" and "exterior" are relative to the working region 22 in that the exterior side 18a generally faces away from the working region 22 and the interior side 18b generally faces toward the working region 22.

Figure 3:
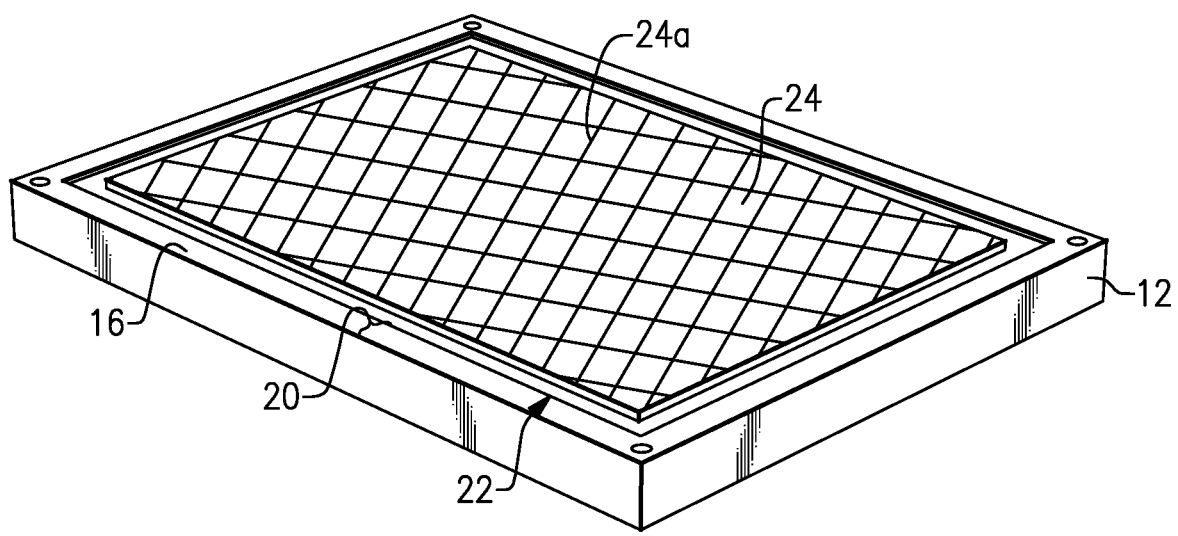
FIG. 3 illustrates a tool segment of the fixture with a fiber preform.

The fiber preform 24 is shown arranged in the working region 22 in FIG. 3. The fiber preform 24 is comprised of ceramic fibers 24a arranged in a fiber architecture. The ceramic fibers are formed of bundles of filaments and may include, but are not limited to, silicon carbide (SiC) fibers or carbon fibers. For instance, the preform 24 may include multiple fiber layers or plies that are laid-up to form the geometry of the end-use article, or a portion thereof. In some instances, the fiber layers or plies are laid-up around one or more mandrels, which may remain in the preform 24 through a portion of the processing and then be removed later on to leave one or more internal cavities in the end-use article. In general, however, the perform 24 is initially devoid of any coating or matrix material.

The tool segments 12/14 each have an array of through-holes 26 that connect the sides 18a/18b and open through the support surfaces S to the working region 22. For instance, the through-holes 26 are arranged in a pattern of rows that span across the working region 22. The through-holes 26 permit inflow of gaseous precursor into the working region 22 during processing, while the pattern facilitates uniform gas distribution.

The seal 16 circumscribes the working region 22. The seal 16 blocks a gap 28 (FIG. 1) between the border mate faces 20 to limit inflow of the gaseous precursor material through the gap 28 into the working region 22. In this example, the seal 16 is a separate and distinct piece from the tool segments 12/14, and is thus removable and replaceable. The seal 16 includes first and second faces 16a/16b. The first face 16a may be in contact with the border mate face 20 of the first tool segment 12 and the second, opposed face 16b may be in contact with the border mate face 20 of the second tool segment 14. The physical presence of the seal 16 in the gap 28 serves to block inflow of the gaseous precursor through the gap 28. Therefore, the only path for the gaseous precursor to reach the working region 22 and infiltrate the fiber preform 24 is through the through-holes 26, to thereby facilitate uniform distribution and build-up of the coating material on the fiber preform 24. Meanwhile, the blocking the gaseous precursor around the edges of the tool segments 12/14 prevents substantial build-up of a thick skin coating between the support surfaces S and the periphery of the fiber preform.

Due to tolerances or other factors, the faces 16a/16b of the seal 16 may not contact or fully interfacially contact the border mate faces 20, leaving a slit or slits there between. The slits, however, are substantially narrower than the gap 28 such that only a small, tolerable amount of gaseous precursor is expected to flow through the slits. A slit or slits may also be present by design, to facilitate disassembly of the fixture 10 by separation of the tool segments 12/14 after processing to retrieve the coated fiber preform 24. For example, as discussed later below, spacing the tool segments 12/14 apart may reduce bridging of the coating material.

The tool segments 12/14 and the seal 16 also include two or more sets of pin holes 30. In the illustrated example (FIG. 2) the fixture 10 includes four sets of pin holes 30, with one set at each of the corners of the fixture 10. A pin 32 is received through the set of pin holes 30. The pins 32 serve to align and secure the seal 16 with respect to the tool segments 12/14.

Figure 4:
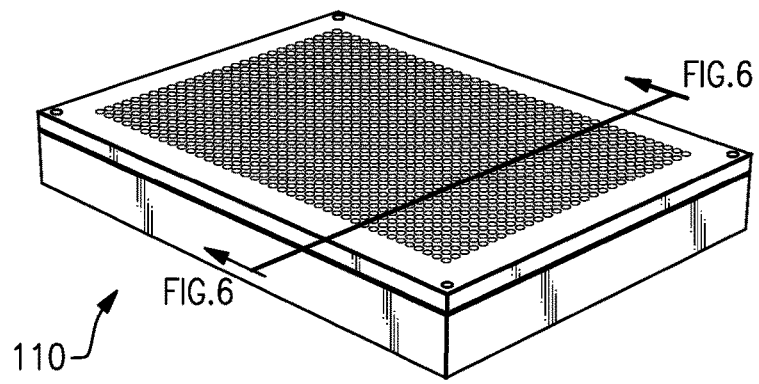
FIG. 4 illustrates another example fixture in which the seal is unitary with one of the tool segments.
Figure 5:
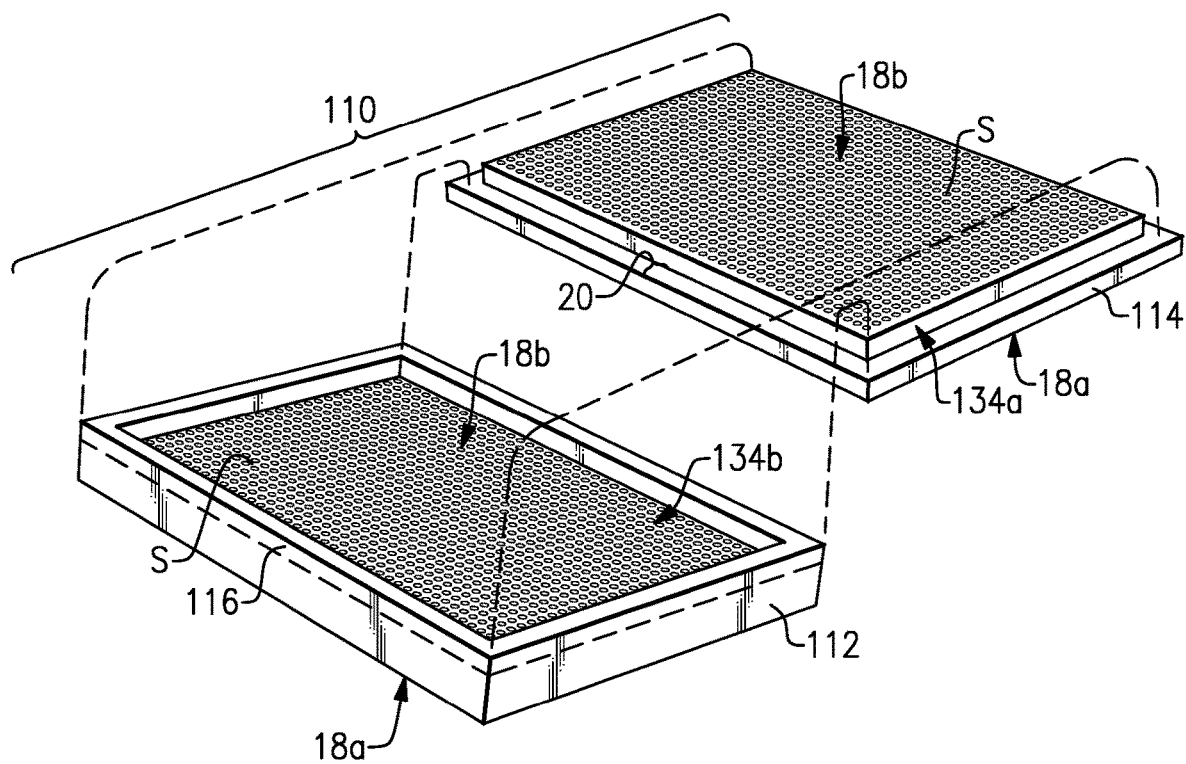
FIG. 5 illustrates an expanded view of the fixture of FIG. 4.

FIG. 4 illustrates an example of another fixture 110, and FIG. 5 illustrates an expanded view of the fixture 110. The fixture 110 includes first and second tool segments 112/114 and a seal 116. In this example, rather than being a separate and distinct piece, the seal 116 is united with the first tool segment 112. For instance, the seal 116 and the first tool segment 112 are integrated as a single, homogenous piece. This may eliminate use of the holes 30 and pins 32, as the seal 116 cannot move or shift relative to the first tool segment 112. Alternatively, holes 30 and pins 32 may still be used to facilitate alignment of the tool segments 112/114 with each other.

The border mate face 20 of the second tool segment 114 in this example is recessed from the support surface S of the second tool segment 114 such that the support surface S is on a plateau 134a. The support surface S of the first tool segment 112 is recessed from the seal 116 so as to define a valley region 134b between the recessed support surface S of the first tool segment 112 and the sides of the seal 116. The valley region 134b is generally of complementary geometry to that of the plateau 134a such that the plateau 134a fits into the valley region 134b when the tool segments 112/114 are brought together with the fiber preform 24 sandwiched between, as shown in the sectioned view of FIG. 6.

Figure 6:
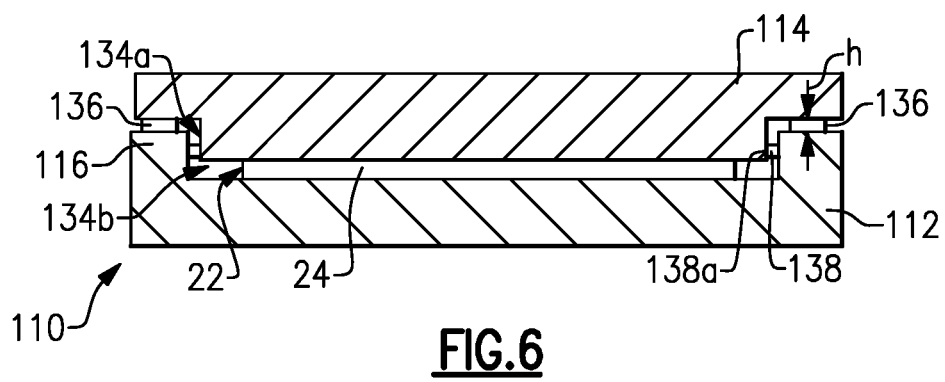
FIG. 6 illustrates a sectioned view of the fixture of FIG. 4, but with additional optional features.

As further shown in FIG. 6, the fixture 110 may further include one or more spacers 136 that are located between the seal 116 and the second tool segment 114. The spacer has a spacer height (h). The spacer 136 separates the tool segments 112/114 and establishes the height of the working region 22 between the support surfaces S. The height of the spacer 136 may be selected to provide a desired working region 22 height for a fiber preform 24 of a given thickness. For instance, the thickness of the fiber preform 24 may exceed the working region 22 height such that the tool segments 112/114 compress the fiber preform 24. The magnitude of compression may be tailored via selection of different sizes of the spacers 136. It is to be appreciated that the spacers 136 may also be used with the fixture 10 to hold the tool segments 12/14 apart. The coating material may deposit on the fixture 10/110 and, if it bridges the tool segments 12/14/112/114, may fuse the segments together and make it difficult to disassemble the fixture to retrieve the coated fiber preform 24. Spacing the tool segments 12/14/112/114 apart may facilitate reductions in bridging. The spacing distance, however, should generally be minimized to reduce inflow of the coating material through the gap 28 into the working region 22. The spacer 136 may extend continuously around the full perimeter of the tool segments 112/114, but alternatively may be segmented and discontinuous.

As also shown, the seal 116 may optionally include a stand-off 138 that projects toward the working region 22 and terminates at a free tip end 138a. The tip end 138a contacts the side of the plateau 34. The stand-off serves to center the second tool segment 114 on the first tool segment 112, while also minimizing the area of contact between the segments 112/114 to reduce the chances of bridging of the coating material. For example, the stand-off 138 is a continuous ridge that extends around the full inner perimeter of the seal 116, but alternatively may be segmented and discontinuous. Alternatively, the external surfaces of the fixture 100 may be utilized for centering, in which case the stand-off 138 may be excluded.

Figure 7:
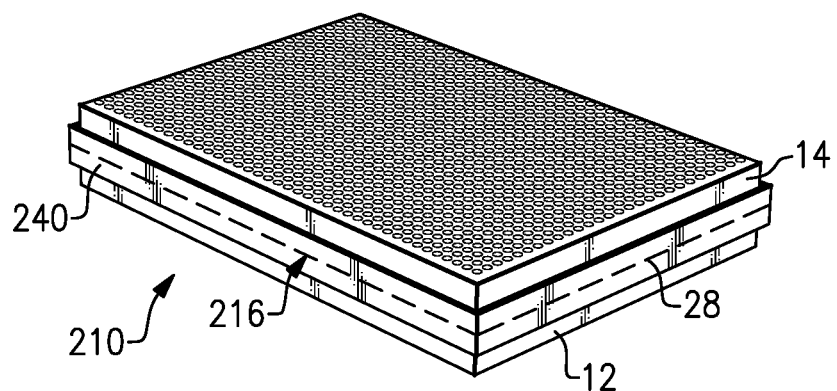
FIG. 7 illustrates another example fixture in which the seal includes a band around the tool segments.

FIG. 7 illustrates another example fixture 210. In this example, the fixture 210 is the same as the fixture 10 except that instead of the seal 16 the fixture 210 includes a seal 216. The seal 216 is a band 240 that wraps around the tool segments 12/14. The band 240 spans across the gap 28 between the tool segments 12/14 and thereby blocks inflow of the coating material into the gap 28. For example, the band 240 includes at least one of a fabric, a foil, or an adhesive tape. An example fabric includes, but is not limited to, a woven carbon cloth. An example foil includes, but is not limited to, a graphite foil, which is a thin, flexible strip of graphite. An example adhesive tape includes, but is not limited to, a fabric, foil, or other flexible substrate that has adhesive on one side to attach the tape to the tool segments 12/14. In further examples, the band 240 is used in combination with the seal 16 or the seal 116, to further inhibit inflow of coating material through the gap 28 into the working region 22.

An example method of processing a CMC article using the fixtures 10/110/210 herein includes situating the fiber preform 24 in the working region 22 of any of the fixtures 10/110/210, providing the seal 16/116/216 that circumscribes the working region 22, and then exposing the fixture 10/110/210 with the preform 24 to a flow of gaseous precursor. The seal 16/116/216 blocks inflow of the gaseous precursor through the gap 28 around the edges of the tool segments 12/14/112/114. Therefore, the only path for the gaseous precursor to reach the working region 22 and infiltrate the preform 24 is through the through-holes 26. The gaseous precursor may be an interface coating precursor or a matrix precursor, such as but not limited to, boron trichloride (BCl3) or methyltrichlorosilane (MTS).

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A fixture for processing a ceramic matrix composite article, the fixture comprising:
   first and second tool segments each having an exterior side and an interior side, the interior side having a border mate face, the interior side of the first tool segment facing the interior side of the second tool segment such that the border mate faces align and circumscribe a working region for holding a fiber preform that is to be coated with a ceramic material, the first and second tool segments each having an array of through-holes that open to the working region to permit inflow of gaseous precursor into the working region, the first and second tool segments each including a support surface facing the working region and through which the through-holes extend, and the border mate face of the second tool segment is recessed from the support surface of the second tool segment such that the support surface of the second tool segment is on a plateau; and
   a seal circumscribing the working region, the seal blocking a gap between the border mate faces to limit inflow of the gaseous coating material through the gap into the working region, and the seal is united with the first tool segment.

2. The fixture as recited in claim 1, wherein the first and second tool segments and the seal are graphite.

3. The fixture as recited in claim 1, wherein the seal includes a first face that is in contact with the border mate face of the first tool segment and a second, opposed face that is in contact with the border mate face of the second tool segment.

4. The fixture as recited in claim 1, wherein the support surface of the first tool segment is recessed from the seal.

5. The fixture as recited in claim 1, further comprising one or more spacers between the seal and the second tool segment, the one or more spacers having a spacer height that establishes a height of the working region between the support surfaces.

6. The fixture as recited in claim 1, wherein the seal includes a stand-off projecting there from to a free tip, the free tip contacting a side of the plateau.

7. The fixture as recited in claim 6, wherein the stand-off is a ridge that circumscribes the plateau.

8. The fixture as recited in claim 1, wherein the first and second tool segments and the seal include two or more sets of pin holes that are aligned, and two or more pins receivable in the two or more sets of pin holes, the pins aligning and securing the seal with respect to the first and second tool segments.

9. The fixture as recited in claim 1, wherein the seal and the first tool segment are a single, homogenous piece.

10. A method for processing a ceramic matrix composite article, the method comprising:
    providing a fixture that includes first and second tool segments that each have an exterior side and an interior side, the interior side has a border mate face, the interior side of the first tool segment faces the interior side of the second tool segment such that the border mate faces align and circumscribe a working region, the first and second tool segments each having an array of through-holes that open to the working region, the first and second tool segments each including a support surface facing the working region and through which the through-holes extend, and the border mate face of the second tool segment is recessed from the support surface of the second tool segment such that the support surface of the second tool segment is on a plateau;
    situating a fiber preform in the working region;
    providing a seal that circumscribes the working region, the seal is united with the first tool segment; and
    exposing the fixture with the preform to a flow of gaseous precursor, the gaseous precursor flowing into the working region and infiltrating the fiber preform to deposit a coating on the fiber preform, wherein the seal blocks a gap between the border mate faces to limit inflow of the gaseous precursor through the gap into the working region so that the gaseous precursor must flow through the through-holes to reach the working region.

11. The method as recited in claim 10, wherein the providing of the seal includes arranging the seal between the first and second tool segments.

12. The method as recited in claim 10, wherein the providing of the seal includes wrapping a band around the first and second tool segments.

13. The method as recited in claim 12, wherein the band includes at least one of a fabric, a foil, or an adhesive tape.

* * * * *